METHOD OF MAKING A NARROW BASE TRANSISTOR

Filed May 24, 1965

INVENTORS
Joseph Lindmayer
Charles Y. Wrigley
Richard R. Garnache
BY Connolly and Hutz
ATTORNEYS United States Patent Office 3,455,748

Patented July 15, 1969

3,455,748

METHOD OF MAKING A NARROW BASE TRANSISTOR

Joseph Lindmayer and Charles Y. Wrigley, Williamstown, and Richard R. Garnache, Clarksburg, Mass., assignors to Sprague Electric Company, North Adams, Mass., a corporation of Massachusetts Filed May 24, 1965, Ser. No. 458,075

Int. Cl. H01l *11/06*

U.S. Cl. 148—175 1 Claim

ABSTRACT OF THE DISCLOSURE

A first epitaxial layer of one conductivity type is formed over a collector wafer of opposite conductivity type. Thereafter an impurity of the one conductivity type is disposed in the layer to provide a low concentration of that impurity throughout a major portion of the layer and an effective base region of high conductivity, approximately .01 mil thick, adjacent its surface. A second layer having low conductivity of the one conductivity type is then epitaxially grown over the first layer, and an emitter region of the opposite conductivity type is disposed in the second layer adjacent its surface.

This invention relates to an improvement in making a transistor and more particularly to making a transistor having a very thin effective base region.

In a transistor, the space charge region or depletion layer has mobile carriers withdrawn under a voltage. It is desirable in a high-speed transistor to keep the collector capacitance and the base resistance low as the speed of the device is inversely proportional to $R_b$ $C_c$. Accordingly, it is advantageous to provide a transistor collector in which the depletion region of the collector is constant under changing collector bias while the base region adjoining and in contiguity with the collector has a low lateral resistance. Thus, at voltages above a small collector bias, the depletion region extending to the effective base provides a constant and small collector capacitance coupled with the low base resistance in the narrow effective base and advantageously enhances the ultimate speed of the resultant transistor.

It is useful to create such transistor elements in a planar transistor. The planar construction is highly useful as it lends itself to the production of a number of circuit elements and components on a single conductive body of semiconductive material. This multiplicity in turn is desirable in improving the density of parts in electronic circuitry.

Further, it is advantageous to be able to form a planar transistor with its electrodes in essentially planar planes on the same side of a semiconductor slice.

An object of this invention is to provide an improved method for fabricating planar transistors.

Another object is the production of a narrow base planar transistor having a region of low impurity concentration between the effective base and the collector.

Still another object is the production of a transistor having a linear gigacycle operating range.

A still further object is to provide a method of producing a narrow effective base of low resistance between two regions of lower concentration of the same conductivity.

Figure 1:
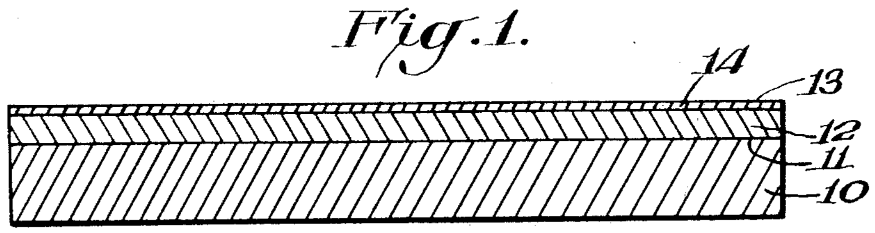
Figure 2:
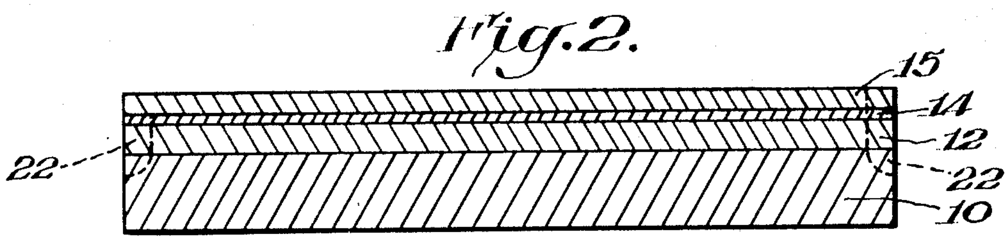
Figure 3:
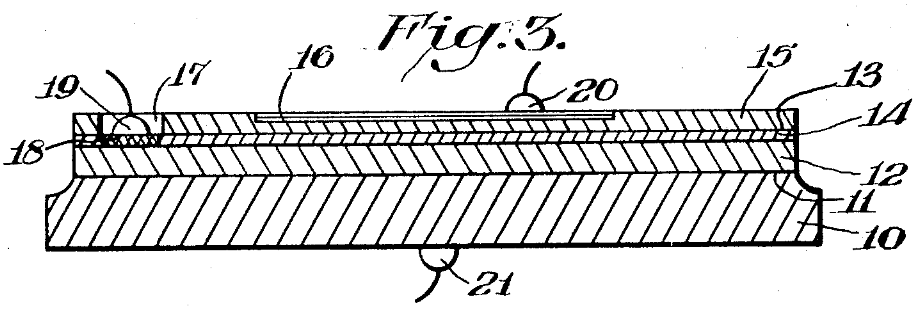
Figure 4:
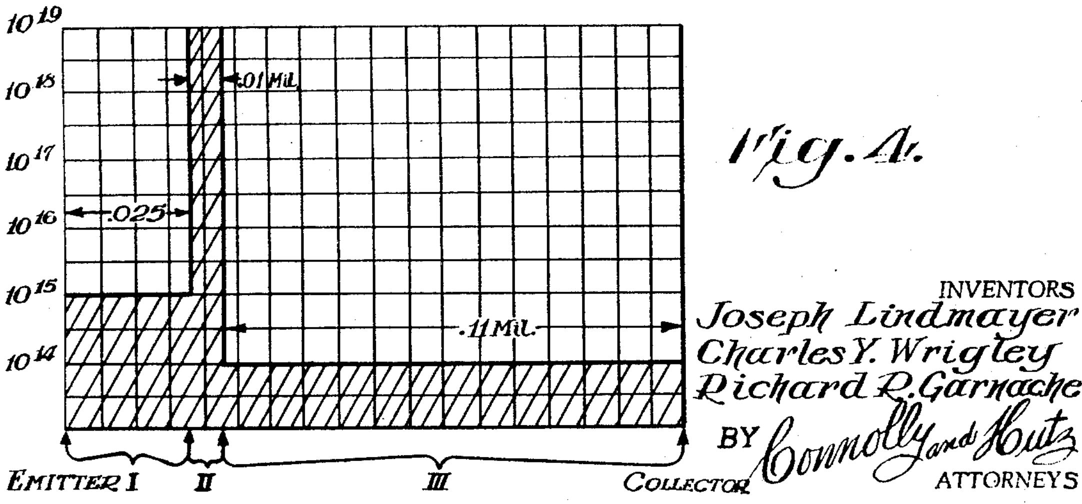

FIGURES 1–3 are schematic sectional diagrams illustrative of the method of fabricating the semiconductor structure according to this invention; and FIGURE 4 is a graph depicting impurity distribution of the base region in a typical device of the structure of this invention illustrated in FIGURE 4.

In general, this invention provides a transistor having a base in which a high impurity region is enclosed by low impurity regions. The technique of this invention provides conductivity regions of relatively different impurity distribution by the combined process of diffusion and epitaxial growth by vapor deposition. By this technique a fine control is achieved of the effective base thickness and the impurity profile in the base regions adjacent to the emitter and collector junctions.

Briefly, the process consists of first growing epixtaxially on a wafer of N-type semiconductor material a first layer consisting of low impurity P-type material. A controlled quantity of a suitable P-type impurity is then deposited on an open surface of the epitaxially grown first layer. The first layer and the impurity are then heat-treated to produce a desired distribution of the P-type impurities within the first layer by diffusion. The impurities form a very thin area of low resistance in the first layer. This low resistance heavily concentrated P-type region extending across the exposed first layer is the desired narrow effective base region of low resistance and the N-type wafer is the collector while the remaining portion of the first layer is a lightly doped P-type region of the base.

Subsequently, there is an epitaxial growth of semiconductor material forming a second layer consisting of the same P-type material as the first layer. The growth of the second layer upon the heavily doped P-type region of the first layer results in an impurity concentration in the second layer of somewhat greater magnitude than that concentration existing in the low impurity region of the first layer. Finally, an emitter junction is formed on a portion of the surface of the second layer by depositing a controlled quantity of a suitable N-type impurity thereon and heat treating the second layer to produce a desired concentration of the N-type impurities near the surface of the second layer. Finally, an effective contact is achieved with the heavily concentrated P region or so-called effective base region. Electrical contacts are also applied to the collector and emitter regions.

Referring to the figures, the transistor of this invention is formed on an N-type substrate. As shown in FIGURE 1 a wafer 10 of suitable N-type conductivity such as single crystal silicon suitably provided with an N-type conductivity has a surface 11 on which is epitaxially grown a first layer of monocrystalline semiconductor material of P-type silicon.

After the first layer 12 has been grown on the substrate 10 a suitable P-type impurity is deposited on a surface 13 of the first layer 12, for example, boron, aluminum, indium or gallium may provide the P-type conductivity but it will be understood that these are set forth merely by way of illustration. The diffusion of the impurities into the layer 12 is controlled to provide a narrow heavily doped P-type region at the surface 13 and to provide a very lightly doped region in the remainder of the layer 12. As illustrated in FIGURE 1 the effective base region 14 is formed within the layer 12 in a very thin region extending across the surface 13, just below the surface 13. The heat treatment and supply of impurities producing this indiffusion are arranged so as to produce the desired narrow effective base region of low resistance and the light doping throughout the remainder of the layer 12 to the surface 11. The N-type substrate 10 is connected as the collector of the transistor and the collector junction is at the surface 11 in the product transistor.

Next a second layer 15 of P-type monocrystalline silicon material is epitaxially grown on the surface 13 as shown in FIGURE 2. The layer 15, similar to the layer 12, may be produced by a suitable epitaxial technique, for example, growth from a gaseous silicon tetrachloride in a hydrogen carrier by reduction of the silicon tetrachloride. The layer 15 is grown to provide a thickness suitable for a region of low level P-type conductivity between the heavily doped effective base region 14 and an emitter 16. The second layer 15 is of the same P-type conductivity as the first layer 12 and has an impurity concentration similar to that of the low impurity region of layer 12. This region, adjacent the emitter, enhances the injection efficiency and reduces the emitter capacitance of the transistor.

Finally, a suitable N-type impurity such as phosphorus, antimony or arsenic is deposited on a selected area of the second layer 15 and diffused into the second layer to form a diffused N-type emitter region 16.

An opening 17 is produced in the layer 15 at a point removed from the emitter region 16. The opening 17 extends to the base region 14. A P-type impurity introduced into the layer 12 at the region 14 in the opening 17 provides a heavily doped P-type region 18, similar to region 14, which is characterized by a reduced resistance to electrical connection to the effective base region 14. The region 18 is the same conductivity as the effective base region 14 and extends substantially into the region 14.

A P-type region suitable for electrical connection to the effective base region 14 may also be formed without opening layer 15 by diffusing a P-type region extending from the surface of layer 15 to region 14. It should be noted, however, that since the penetration of the base contact region is greater than that of the emitter, the base contact region in this modification should be formed before the emitter.

A structure as illustrated in FIGURE 3 is then produced by etching away the regions 22 on the respective sides to form a mesa by photolithographic techniques. This removes any overlap of regions at the edges of the structure.

A metal electrode 19 of aluminum or the like is attached to the region 18. Good ohmic contact is achieved. Finally, a suitable metal contact 20 is attached to the emitter region 16 and a suitable metal contact 21 is applied to the collector substrate 10 to provide the collector contact. The transistor device is thus completed.

The transistor is made up of the N-type collector substrate 10, the collector junction at surface 11, the low level P-type impurity region of layer 12 from the collector junction to the effective base 14, the heavily doped P-type effective base region 14 in the layer 12 at the surface 13, the low level doped P-type region of layer 15 extending from the surface 13 to the N-type emitter region 16. These transistor parts together with their respective electrode contacts are a typical structure of this invention.

In a typical production of the embodiment of this invention the impurity distribution of the regions between the emitter and collector junctions is characterized by three relatively well defined regions of different impurity concentration. These are denoted generally in the graph of FIGURE 4 as Region I, Region II, and Region III. The abscissa denotes the physical dimension of the P-type region from emitter junction to collector junction in the cross section of the transistor normal to the surfaces 11 and 13. The ordinate denotes the P-type impurity concentration of the regions in atoms/cm.$^3$. The Region I of FIGURE 4 represents the low P-type impurity region of layer 15 extending from the emitter 16 to the heavily concentrated P-type region 14. The Region II represents the heavily concentrated P-type impurity region 14 of layer 12. Region III represents the remainder of layer 12 which is the low P-type impurity region extending from region 14 to the collector junction at surface 11 of the collector 10.

Under bias conditions, in excess of a few tenths of a volt, the collector space charge will extend across the Region III, resulting in a high accelerating field across Region III with a maximum velocity of holes in this region such that the effective base of the transistor is confined to the narrow Region II. The transit time of a signal across Region III will be about 0.05 nanosecond. Thus, the bias results in an effective base width of .01 mils confined to the heavily doped region of the P-type layers, even though the P-type layers extend from the collector junction to the emitter junction. This provides low junction capacitance, since the P-type impurity concentration is low adjacent to each junction, while providing high punch through voltage at the concentrated P-type region.

The low impurity P-type region I adjacent to the emitter junction is doped with an impurity concentration of approximately $10^{15}$ cm.$^{-3}$ and a forward bias space charge depth of about 0.025 mil results. It is noted that a lower doping will simply have the space charge slightly overlapping the high doped P-type region without changing the junction capacitance. If the distance across Region I is, as indicated, about 0.025 mil the transit cut-off frequency is about 5K mc./sec. For an emitter junction diameter of 5 mils the emitter depletion layer capacitance is about 4 picofarads. At 5 ma. forward current this results in an emitter input cut-off frequency of about 8K mc./sec. The resulting alpha cut-off frequency of the three regions I, II and III is about 2.7K mc./sec. This is about a factor of 10 improvement over comparable transistors.

In the embodiment described, a typical base resistance $R_b$ is approximately 40 ohms with a collector capacitance, under bias, of 1.3 to 1.5 picofarads. This gives an $R_b C_c$ product of 55 picoseconds which results in an overall alpha cut-off frequency of approximately 1K mc./sec. This is still a factor of 5 improvement over comparable transistors. Higher alpha cut-off frequencies and more productive bias voltages are possible.

In addition to other advantages, this transistor has a linear gigacycle frequency operating range.

The device illustrated may also be produced by modification of the described process such as by epitaxial growth of the emitter rather than by the diffusion process. Other examples would be to diffuse the low concentration P-type region adjacent to the emitter and epitaxially grow the emitter or to diffuse both of these regions.

It should be understood, that although the preferred embodiment has been described in terms of a NPN transistor, the device and process illustrated may be employed to produce a PNP transistor as well, although, obvious modifications would be required. Moreover, semiconductor materials other than silicon may be employed to produce a transistor in accordance with this invention.

Thus, many different embodiments of this invention may be made without departing from the spirit and scope hereof and, therefore, the invention is not to be limited except as defined in the appended claims.

What is claimed is:

1. A method of making a semiconductor device including epitaxially growing a first layer of semiconductor material of one conductivity type on a collector wafer of opposite conductivity type, diffusing an impurity of said one conductivity type in said first layer, distributing a low concentration of approximately $10^{14}$ atoms/cm.$^3$ of said impurity throughout the major part of said first layer and restricting a high concentration of approximately $10^{19}$ atoms/cm.$^3$ of said impurity to a region of approximately .01 mil thick adjacent the surface of said first layer to provide a narrow effective base of low resistivity, epitaxially growing a second layer of semiconductor material of said one conductivity and a low concentration of approximately $10^{15}$ atoms/cm.$^3$ on said first layer to provide a narrow effective base of high impurity concentration enclosed by low impurity base regions, diffusing in said second layer an impurity of said opposite conductivity type to form an emitter, and attaching ohmic contacts to said collector, said emitter, and said effective base.

References Cited

UNITED STATES PATENTS

| | | | |
|---|---|---|---|
| 2,777,001 | 1/1957 | Cohen | 317—235 |
| 2,811,653 | 10/1957 | Moore | 317—235 |
| 3,196,327 | 7/1965 | Dickson, | |
| 3,211,972 | 10/1965 | Kilby et al. | |

FOREIGN PATENTS

| | | |
|---|---|---|
| 240,329 | 5/1960 | Australia. |

L. DEWAYNE RUTLEDGE, Primary Examiner

P. WEINSTEIN, Assistant Examiner

U.S. Cl. X.R.

148—186, 187, 33.5; 317—235